US006738737B1

(12) United States Patent
Carter

(10) Patent No.: US 6,738,737 B1
(45) Date of Patent: May 18, 2004

(54) RACE CONDITION ORDERING AND FUNCTIONAL VERIFICATION SYSTEM AND METHOD

(75) Inventor: Hamilton B. Carter, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/252,176

(22) Filed: Feb. 18, 1999

(51) Int. Cl.[7] .......... G06F 17/50

(52) U.S. Cl. .......... 703/17; 719/318

(58) Field of Search .......... 709/310–318; 714/30–39; 719/318; 703/13–17

(56) References Cited

U.S. PATENT DOCUMENTS 5,018,089 A * 5/1991 Kanazawa .......... 703/16
5,426,768 A * 6/1995 Kanazawa .......... 703/16
5,506,963 A * 4/1996 Ducateau et al. .......... 709/107
5,594,904 A * 1/1997 Linnermark et al. .......... 717/124
5,696,942 A * 12/1997 Palnitkar et al. .......... 703/17
5,740,353 A * 4/1998 Kreulen et al. .......... 714/42
5,838,948 A * 11/1998 Bunza .......... 703/27
5,872,909 A * 2/1999 Wilner et al. .......... 714/38
6,141,790 A * 10/2000 Beausang et al. .......... 716/5
6,336,139 B1 * 1/2002 Feridun et al. .......... 709/224
6,466,898 B1 * 10/2002 Chan .......... 703/17

* cited by examiner

*Primary Examiner*—St. John Courtenay, III
(74) *Attorney, Agent, or Firm*—Steven Lin, Esq.

(57) ABSTRACT

An event sequencer for a functional mechanism contains a list of signatures and corresponding priority designations, and an event list containing event information from race condition events that are to be re-ordered. A method for sequencing race condition events, includes storing signatures for identifying predetermined events, storing priority designations corresponding to the signatures to enable identification of relative priorities between identified events, detecting at least first and second events and information about each event, storing only upon signature match the events and event information associated with each event, sorting the events, and sending the sorted events to a functional mechanism. Events are compared with stored signatures, and signature matches are determined. The arrival of events is detected, events are compared with stored signatures, and matches between events and signatures are established.

21 Claims, 6 Drawing Sheets

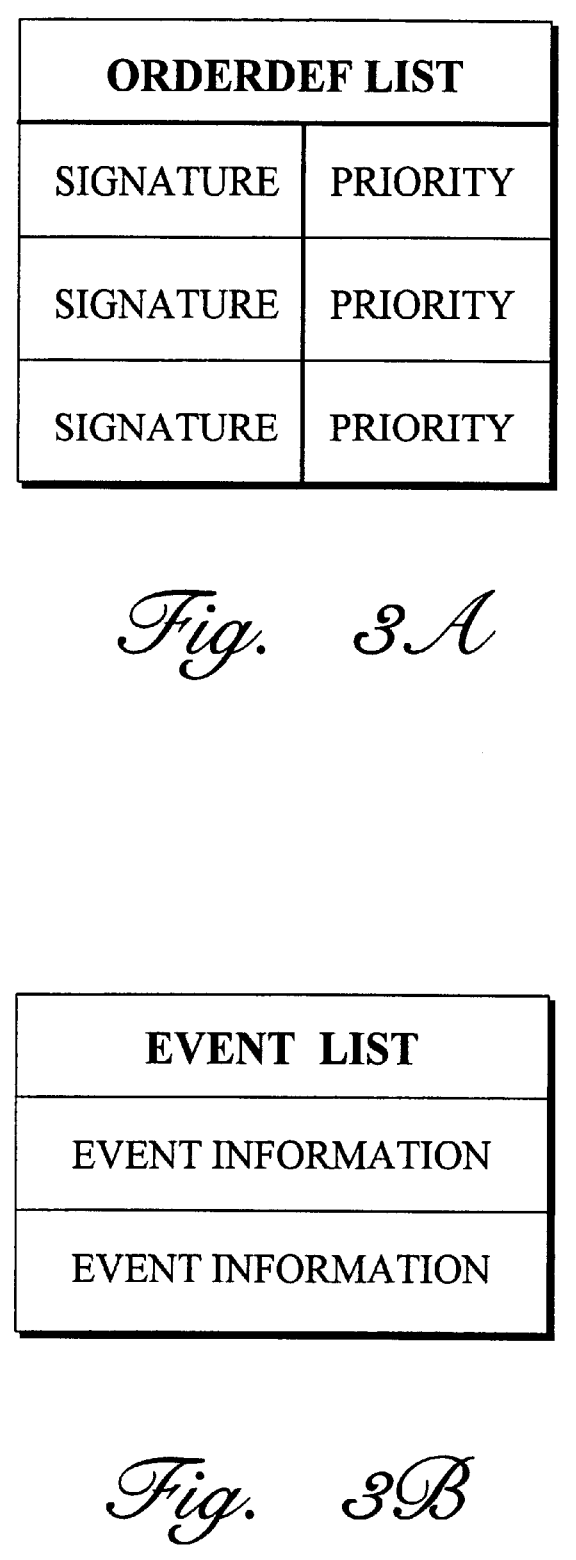

| ORDERDEF LIST | |
|---|---|
| SIGNATURE | PRIORITY |
| SIGNATURE | PRIORITY |
| SIGNATURE | PRIORITY |

Fig. 3A

| EVENT LIST |
|---|
| EVENT INFORMATION |
| EVENT INFORMATION |

Fig. 3B

RACE CONDITION ORDERING AND FUNCTIONAL VERIFICATION SYSTEM AND METHOD

BACKGROUND OF THE INVENTION

1. Field of the Invention

This application relates to functional verification operations, and more particularly to race condition ordering systems and methods used in functional verification modeling.

2. Description of Related Art

Pre-silicon verification operations consume as much as 50% of the total design time for system-on-a-chip projects. Such design verification includes simulation in a hardware description language (HDL) and comparison of the simulation results with functional model design results based upon the same stimulus. A race condition in HDL simulation includes one or more signals changing in the same time slice, when an operation depends on the order of occurrence of particular signal changes. As a result, HDL simulation does not guarantee an identical evaluation under race conditions. In HDL design descriptions, race conditions in a design need to be methodically planned for and avoided, to ensure hardware operation upon design implementation. In HDL simulators, the order of operations is not specified as to race conditions. However, in constructing functional models for verification, dealing with race conditions is unavoidable. For example, it may be necessary to compare an HDL code block output with results derived from certain inputs. Early during design, simulations are run without considering timing delays. Further, the inputs and outputs of a block may be propagated for functional verification during the same time slice. This presents an undesired race condition under which it is unclear which information will first be used, which detrimentally affects the results of verification, because depending upon the order of arrival of simulation events at a functional verification model, false failures are detectable. According to one current approach, complex semaphores are employed to ensure operability in the face of race conditions. Such complex solutions are dependent upon particular race conditions, and the design of the software code for the solutions is time-consuming and inefficient. Further, the use of semaphores creates ambiguities which detrimentally affect maintenance and reusability of the functional model.

It is desirable that solutions be developed which limit computational overhead to a minimum and which require a minimum memory allocation.

SUMMARY OF THE INVENTION

According to the present invention, an event sequencer for a functional mechanism contains a list of signatures and corresponding priority designations, and an event list containing event information including race condition events that are to be re-ordered. A method for sequencing race condition events according to the present invention, includes storing signatures for identifying predetermined events, storing priority designations corresponding to the signatures to enable identification of relative priorities between identified events, detecting at least first and second potential race condition events and information about each event, storing the events and event information associated with each event, sorting the events, and sending the sorted events to a functional mechanism. Events are compared with stored signatures, and signature matches are determined to determine whether an actual race condition exists. The arrival of events is detected, events are compared with stored signatures, and matches between events and signatures are established. Events are handled by detecting their arrival and making a determination as to whether to enter into a new time slice. Additionally, the events within each time slice are reordered by the sequencer according to the present invention. Finally, the sequencer sends the reordered, stored events to the functional model in a playback mode, according to the present invention.

BRIEF DESCRIPTION OF THE DRAWINGS

FIG. 3A is a diagram of the architecture of a sequencer according to one embodiment of the present invention, in which an OrderDef list is established comprising a plurality of signature and priority relationships, each pair defining an event;

FIG. 3B is a diagram of the architecture of a sequencer according to one embodiment of the present invention, in which an Event list is established with a plurality of items of event information;

DETAILED DESCRIPTION OF A PREFERRED MODE

Figure 1:
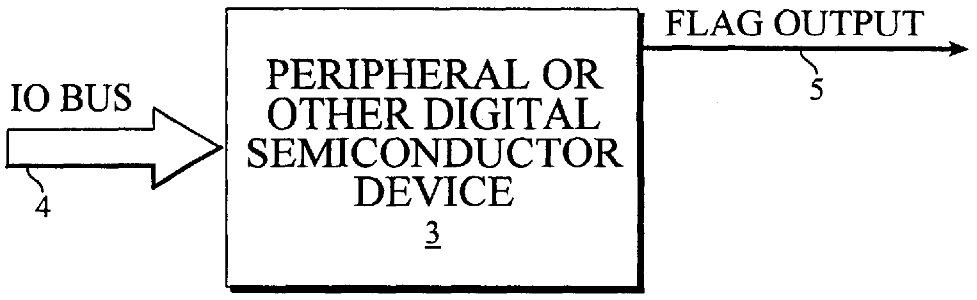
FIG. 1 is a block diagram of a peripheral system connected to an input/output (IO) bus connected to a master (not shown) and producing an output flag signal on an output line, according to the prior art.

Referring now to FIG. 1, there is shown a block diagram of a selected peripheral system 3 which is well known. The peripheral system 3 is connected to an input/output (10) bus 4 connected to a master system such as a digital signal processor (DSP) chip (not shown) which controls its activities and with which it communicates. The peripheral system 3 produces an output flag signal on an output line 5, for communication with the DSP. In FIG. 1, a simple race condition may occur during an IO cycle, when data is driven into the peripheral system 3 with a particular address and data. As a result of receipt of this data, the peripheral system 3 is caused to assert a particular logical value at its output flag. A functional verification model is typically used to verify a required device functionality for the peripheral system 3, according to the following rules:

First, the output flag is asserted after every input/output cycle, to indicate completion of the particular cycle.

Second, the output flag is never asserted without the occurrence of a prior qualifying input/output cycle.

Figure 2A:
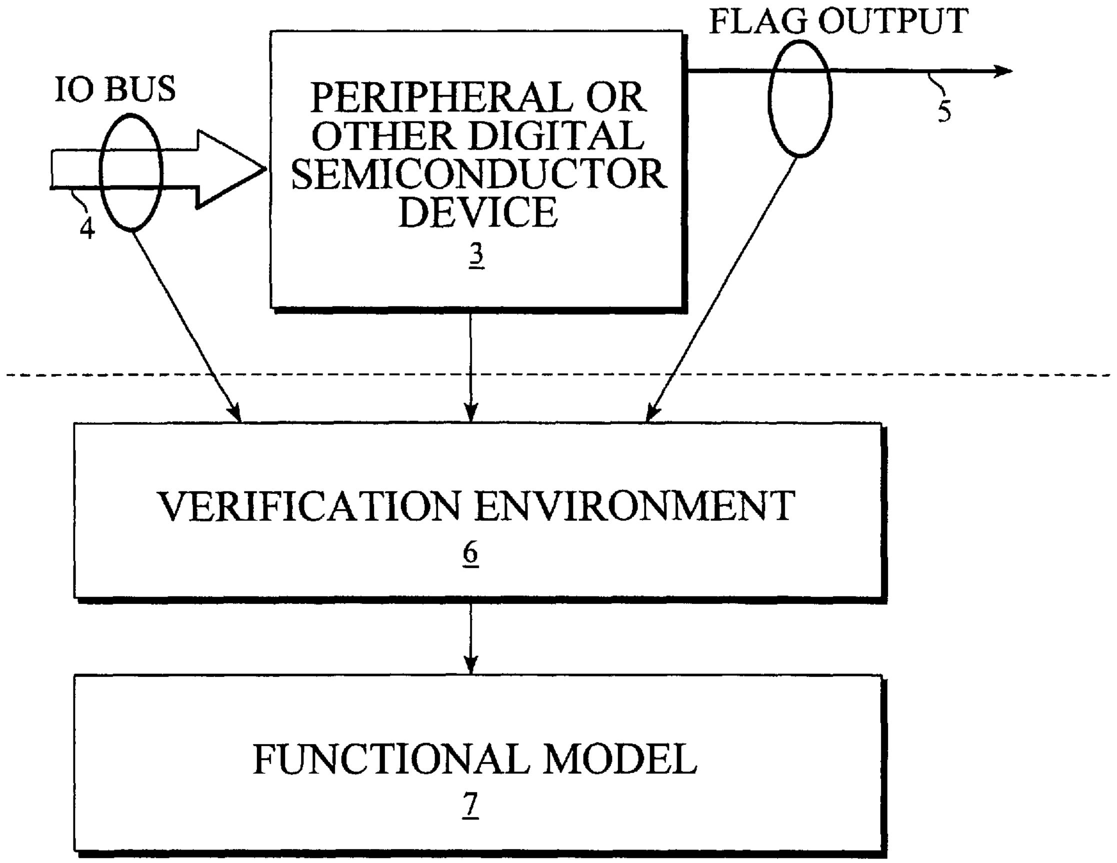
FIG. 2A is a block diagram of a peripheral system connected to an input/output (IO) bus in turn connected to a master and producing an output flag signal on an output line, to provide signals for receipt by a predetermined verification signal which processes the received signals for transfer to a functional model of the peripheral system, according to the prior art.

Referring now to FIG. 2A, there is shown a block diagram of a peripheral system 3 connected to an input/output (IO) bus 4 in turn connected to a master system and producing an output flag signal on an output line 5. The IO bus 4 and the output line 5 provide signals and signal values for receipt by a predetermined verification environment 6 which processes (i.e., decodes) the received signals into messages for transfer to a functional model 7, which represents the functionality of the peripheral system 3 without being bound to representation of particular input components of the peripheral system 3, as is well known according to the prior art. The verification environment 6 which is connected to the peripheral system 3, is configured to perform functional verification tasks with respect to the operation of the peripheral system 3, according to the two rules indicated above. An HDL description of the particular design of the indicated peripheral system 3 is accordingly simulated using a commonly employed HDL simulator. The inputs and outputsof the design of the functional model 7 are accordingly monitored and passed to a verification design environment framework 6. The framework 6 performs some decoding of the raw signals from the simulation, and then calls functions in the functional model 7 to notify it of the design behavior. Based upon these behavioral notifications, the functional model 7 determines whether the design is properly represented. For example, if the verification environment sends two types of messages: a first message describing input/output cycles that enter the particular design, and the other message describing a current value of the flag output pin 5 driven by the design. The two messages are sent to the functional model through a standardized function call. The functional model 7 operates as follows according to the present invention. When a predetermined IO cycle event occurs, causing a particular flag indication, a counter is incremented. Further, when the functional model 7 recognizes an appropriate flag output assertion 5, it decrements a counter. The table which follows indicates three error conditions for functional model 7, according to one embodiment of the present invention:

| Error Condition | Reason |
|---|---|
| Counter is incremented to a value greater than one (1) | A second appropriate IO cycle has entered the peripheral before the flag assertion occurred for the first qualifying IO cycle. |
| Counter is decremented to a value less than zero (0) | A flag assertion was detected when no qualifying IO cycle has arrived at the device. |
| The counter is greater than zero (0) at the end of the test | A qualifying IO cycle arrived at the peripheral, but the flag was never asserted. |

The flag assertion may actually occur in the same simulation time slice that the IO cycle is detected by the peripheral 3, precipitating a situation which is defined as a functional race condition. An HDL simulator combined with the functional verification environment may propagate two events (IO cycle and flag assertion) to the functional model 7 in either order, since they occurred in the same time slice. The device 3 is nonetheless operating correctly. Depending upon the order of arrival of the events, the functional model may detect a false error condition. The table which follows shows actions taken, when events arrive in proper order during a race condition, in an event ordering which produces no false failures. When the IO cycle arrives, the system counter is incremented. The flag assertion message then arrives, and the counter is decremented to a final counter value of zero (0).

| Event Order | Event | Action |
|---|---|---|
| 1 | IO Cycle | Counter Incremented |
| 2 | Flag Assertion | Counter Decremented |

The following table shows actions taken when events arrive in a wrong order during a race condition. The error created is shown in italics. First, the flag assertion arrives, and the counter is then decremented. The counter is now less than zero (0), which is one of the error conditions in the first table above. Next, the IO cycle arrives, incrementing the counter back to zero (0).

| Event Order | Event | Action |
|---|---|---|
| 1 | Flag Assertion | Counter Decremented (Counter < 0) |
| 2 | IO Cycle | Counter Incremented |

In the above scenario, a false failure will have been produced. Typically, a complex semaphore scheme is designed and added to the functional verification code 7 to ensure that the IO cycle events are always operated on before flag assertion events. This extra code overhead provides no additional verification value. It is inefficient and time-consuming to design, and renders the meaning of the original functional model 7 code ambiguous. It is further inadequate to circumvent or simplify the semaphore design by assuming the HDL simulator and the functional verification environment 6 will pass messages consistently to the functional model 7 in the same order in the event of a race condition.

Figure 2B:
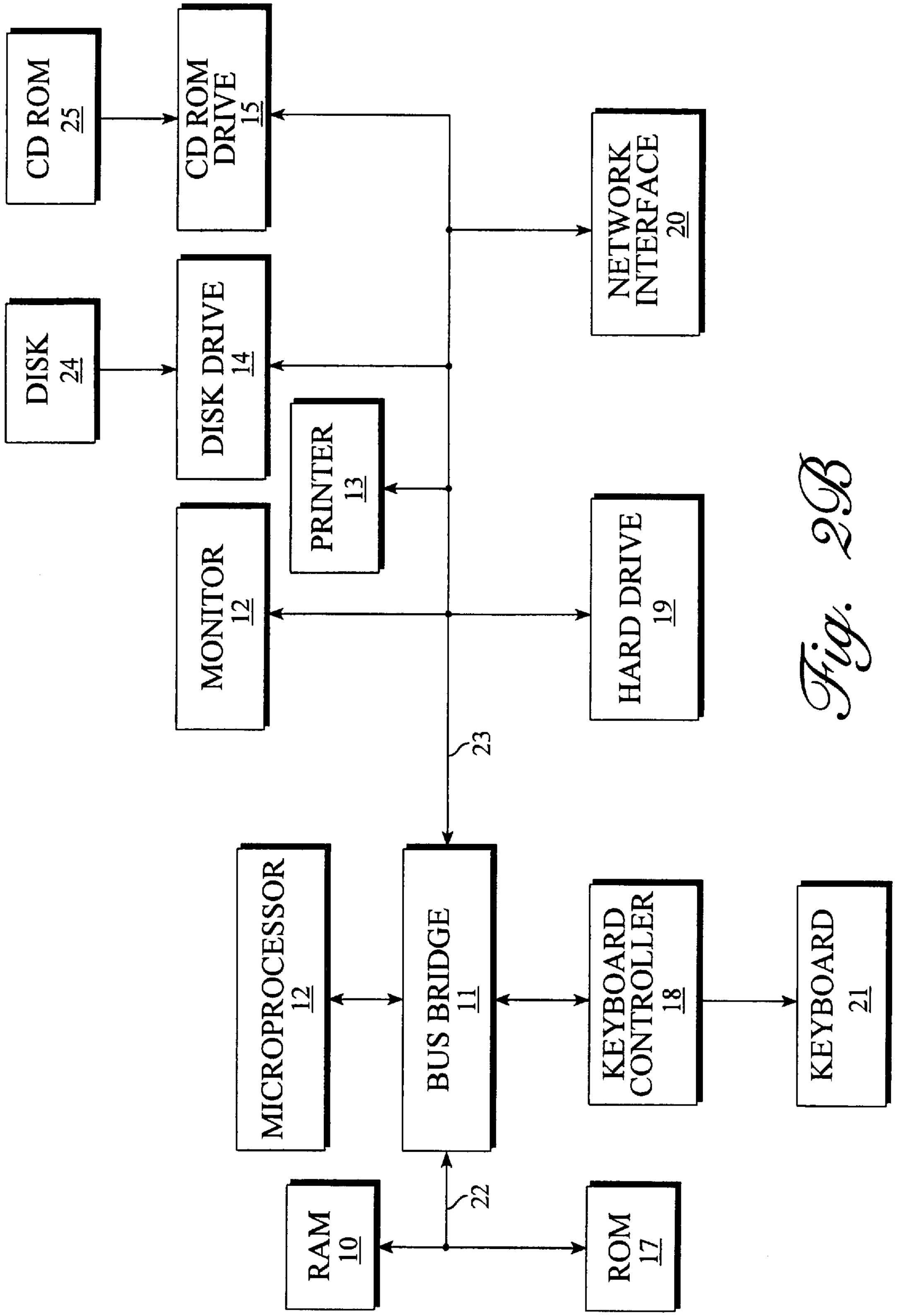
FIG. 2B is a block diagram of a computer system for implementing operation of a computer program product according to the present invention.

Referring now to FIG. 2B, there is shown a block diagram of a computer system 10 for implementing operation of a computer program product according to the present invention. In particular, the computer system 10 includes a random access memory (RAM) 11, monitor 12, a printer 13, a disk drive 14, a compact disk (CD) read only memory (ROM) drive 15, a microprocessor 16, a read only memory (ROM) 17, a keyboard controller 8, a hard drive 19, a network interface 20, a keyboard 21, and first and second buses 22 and 23. First bus 22 connects microprocessor 16 with RAM 11 and ROM 17. Second bus 23 connects microprocessor 16 with monitor 12, printer 13, disk drive 14, CD ROM drive 15, hard drive 19, and network interface 20. Microprocessor 18 is additionally connected to a keyboard controller 18 which in turn is connected to a keyboard for communication with a user. Disk drive 14 is configured to read and write information with respect to a disk medium 24 on which the information is stored, and from which it can be read. CD ROM drive 15 is configured to read information with respect to a CD ROM medium 25 on which the information is stored, and from which it can be read. Computer program products according to the present invention can be embodied on the disk medium 24 or the CD ROM medium 25 or the like (such as an optical or magnetic disk, for example).

Referring now to FIG. 3A, there is shown a diagram of the architecture of a sequencer 10 according to one embodiment of the present invention, in which an OrderDef list is established comprising a plurality of signature and priority relationships, each pair defining an event.

Referring now to FIG. 3B, there is shown a diagram of the architecture of a sequencer 10 according to one embodiment of the present invention, in which an Event list is established with a plurality of items of event information. The Event list according to the present invention holds events that are to be re-ordered for a current simulation time slice. The sequencer 10 buffers any data that was sent with a particular event. As noted above, the verification environment framework 6 communicates simulation events to the functional model 7 through function calls. Therefore, by storing the data passed in each argument of the function calls, the sequencer 10 reproduces the event at a later time. The Event list stores the function call arguments for each event that is to be re-ordered. According to one embodiment of the present invention, the ordered arrival of race condition events at a functional model is ensured according to a pre-defined order as specified by the OrderDef list, independent of the particular functionality and features of the functional model employed. According to the present invention, the correctness of arrival sequences for race condition events in a functional model is ensured by a sequencer, without substantial modification being made of the functional model code. With a sequencer according to the present invention, independence of the functional model is ensured, permitting the sequencer code to be reused in user selected operational modes without reference to a particular functional model. According to the present invention, sequencing of scalable numbers of events is enabled without a concomitant increase in model complexity. Further, such sequencing of race events is independent of and does not affect un-sequenced events. Further according to the present invention, the sequencer obviates the need to modify design-under-test code or HDL code, substantially reducing functional model design times. Additionally, the sequencer of the present invention includes a functional verification modeling framework which is object oriented. The verification framework communicates events from the HDL simulator to the verification functional models via a class hierarchy. A sequencer object placed within the class hierarchy intercepts events intended for the functional model in the order received. By descent of functional model object classes from an existing class hierarchy, the sequencer according to the present invention is available to the functional model. The model code specifies the order in which it must receive race condition events, by calling a predetermined sequencer function. According to an initialization sequence for a functional model used in connection with the present invention, the events to be ordered by the sequencer are registered. Further according to the present invention, the functional model sends a set of unique identifiers (e.g., the event's signature) and the event priority. Events with low numeric priority are ensured to arrive at the functional model before events having higher numeric priority. The verification framework according to the present invention, first forwards each event to the sequencer that is employed by the functional model (by calling the event communication function call for the sequencer). The sequencer compares the signature of the current event to the signatures that are sorted in its OrderDef list. If there is no match or an empty list, the sequencer sends the event to the functional model for immediate action. If there is a match, the sequencer stores the arguments from the event communication function call in an Event list, according to a sequencer event accumulation mode of operation according to the invention. The sequencer repeatedly treats events accordingly until the simulation time slice advances. When the time slice advances, the sequencer sets the time slice a single tick back for its associated functional model. The functional model is accordingly left in the last time slice. The sequencer then orders the events in its Event list according to the priority level stored with each corresponding event signature in the sequencer's OrderDef list. After performing the ordering, the sequencer calls the event communication function of the functional model, sending each set of event arguments from the ordered Event list in turn. By reordering events that arrive at the same time slice, the sequencer ensures that the events will arrive at the functional model in the proper order. Finally, when the sequencer sends the stored events to the functional model, it is in a playback mode. According to a method according to the present invention, race condition events are defined by passing an event signature and a priority level for each race condition event. Verification runs begin with time-slice zero. The sequencer compares each arriving event to the event signatures in its OrderDef list.

After performing the ordering referred to in connection with FIG. 3B, the sequencer calls an event communications function of the functional model, sending each set of event arguments from the Event list in turn. By reordering events that arrive in the same time slice, the sequencer sends the stored events to the functional module, according to a playback mode according to the present invention. In operation, the system for ordering race condition events according to the present invention effects the ordering of race condition events that are to be ordered as defined by passage of the event's signature and priority level for each event to the sequencer. Next, a verification run begins as to a time slice zero (0). Thereafter, during the same time slice, event comparison is accomplished, followed by reordering of events and playback. Thus, the sequencer will have compared each arriving event to the event signatures in an OrderDef list. If an event matches a stored signature, then the sequencer stores the event in its Event list. If the event does not match a stored signature, then the sequencer passes the event to the functional model. When the time slice advances, the sequencer sorts the stored events according to a priority level stored with each event's signature in the OrderDef list. The sequencer sends the events in their sorted order to the functional model for immediate action. The sequencer initially decrements the global time slice so that the functional model will believe it is operating in a previous time slice. The sequencer increments the time slice of the functional model, effectively advancing the functional model to the verification system's global time slice value.

Figure 4:
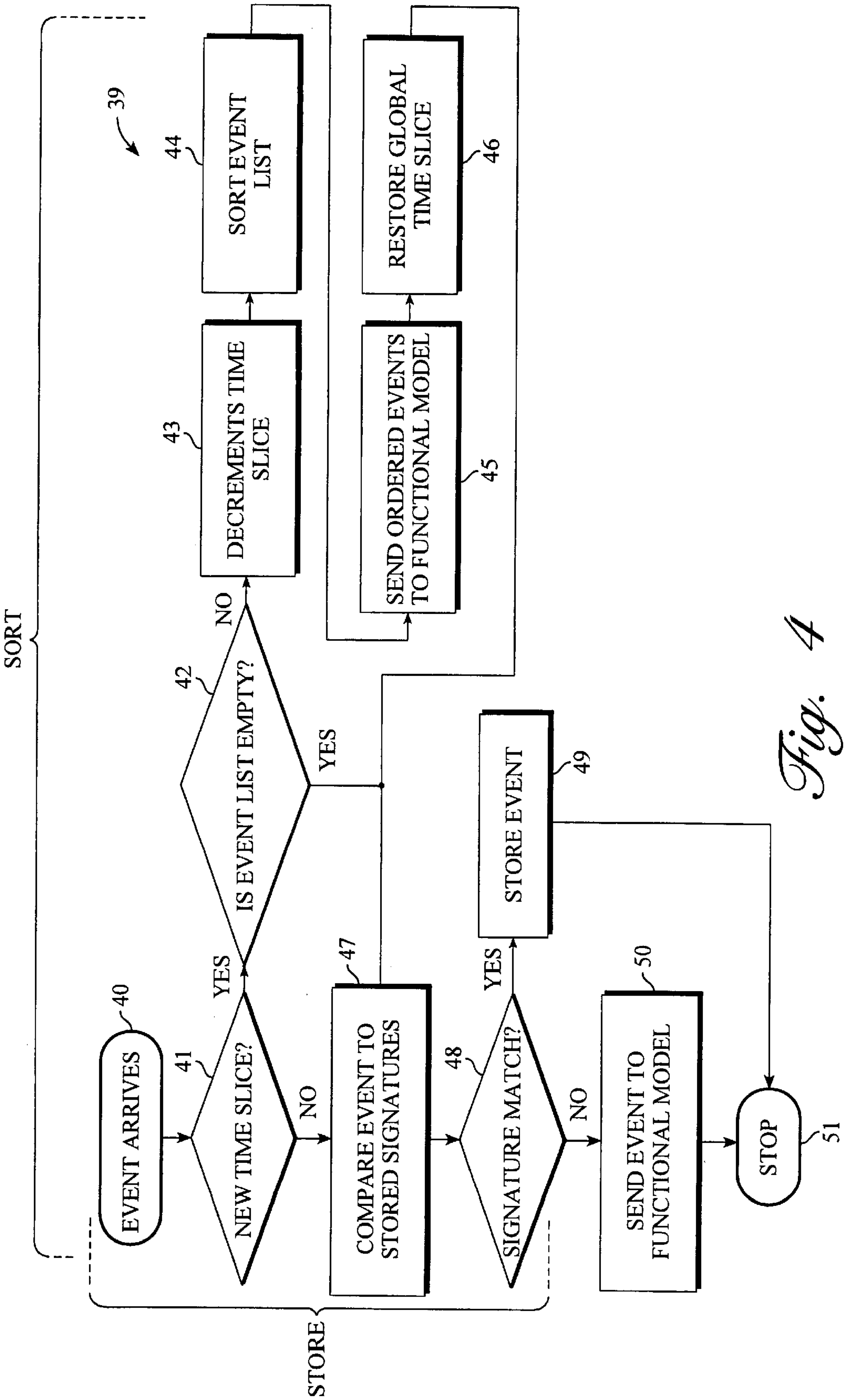
FIG. 4 is a flow chart of sequencer operation according to one embodiment of the present invention.

Referring now to FIG. 4, there is shown a flow chart of sequencer operation 39 according to one embodiment of the present invention. In particular, an event arrives 40 during a particular time slice of simulator operation. Then, a check is undertaken 41 to determine the occurrence of a new, or next time slice with respect to earlier detected events under consideration. If a new time slice has been entered, a determination is made 42 whether the event list is empty. If the event list is empty, a comparison is made 47 of the event just detected with stored signatures. If the event list is not empty, the current time slice value is decremented 43, the event list is sorted 44, the ordered events produced by sorting are sent 45 to the functional model 7, and the global time slot is restored 46. If no new time slice has occurred 41, the applicable event is compared 47 to the stored event signature(s). After comparison between an event and the stored signature(s) has been completed, an evaluation is made for signature matches 48. If a signature match is found 49, the identified event is stored 49 and operation stops 51. If no match is found 50, the event is sent to the functional model 50 without further ado, and thereafter operation stops 51.

Figure 5:
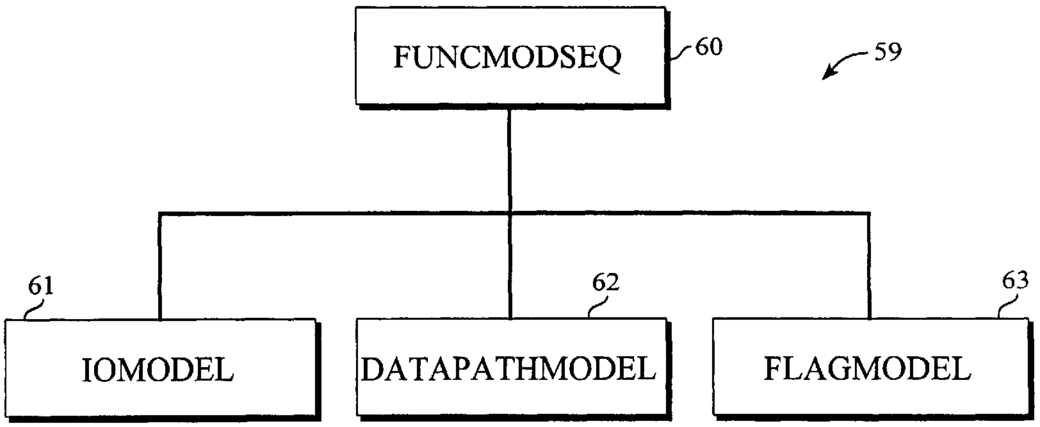
FIG. 5 is an example of a verification system class hierarchy according to an embodiment of the present invention.

Referring now to FIG. 5, there is shown an example of an object-oriented verification system class hierarchy 59 according to an embodiment of the present invention. The hierarchy 59 according to one embodiment includes a functional model sequencer 60 (i.e., FuncModSeq) which has three functional models: an input output model 61 (i.e., IOModel), a data path model 62 (i.e., DataPathModel), and a flag model 63 (i.e., FlagModel). As suggested in the hierarchy 59, the functional verification environment 6 according to one implementation of the present invention is an object-oriented system in which all the functional models are descended from a common function model class FuncModSeq. This class provides a polymorphic interface that allows the verification framework to communicate with any number of different functional models without modifying the verification framework, as indicated in FIG. 5. In particular, the functional model FlagMod checks the behavior of all flags within the design. DataPathModel checks the behavior of all data paths within the design. Finally, IOModel checks the behavior of all IO cycles received and transmitted by the design. The verification system 6 sends event messages to each of the functional models by calling their respective SendEvent__Func functions. The SendEvent__Func is defined as a virtual function of the FuncModSeq class. SendEvent__Func is not overridden in any of the functional model classes descended from FuncModSeq. The SendEvent__Func function provides a level of indirection that is common to selected functional models. It is a location according to the present invention to place desired service code that descended classes can make use of. The sequencer is located in the SendEvent__Func function so that functional models descended from the FuncMod class may use the sequencer to define race condition event ordering. A pure virtual function, SendEvent, is defined in the FuncModSeq class. Each of the functional model classes is required to override this function. The SendEvent function is where each functional model operates on the events that is receives. It is the job of the SendEvent__Func function to forward the event messages to the Send Event function of each functional model. During initialization of the verification system when each functional model's constructor is invoked, each of the functional models sends the event signatures of race condition events that must be ordered to the functional model's associated sequencer. The functional model also sends the priority to be assigned to the events with the given event signature. The functional model sends this information using a function (AddOrderConstraint) defined in the FuncModSeq parent class. The sequencer further contains a variable that stores the value of the current time in the simulation, called CurrTime to store the simulation time when the latest event was stored by the sequencer. As events arrive at the sequencer, it checks the signature of the current event (evNewEvent) against the stored event signatures in the OrderDef list. If the current event's signature matches an event signature stored in the list, then the current event is stored in the event list. If not, then the sequencer forwards the event to the functional model by calling the functional model's Send Event function. Execution continues in an accumulation mode until the time slice of the simulation is advanced. When SendEvent__Func is called, the sequencer compares CurrTime with the global time slice to determine whether a new time slice has been entered. If the two values are equal, then the sequencer operates as indicated above. If not equal, then the time slice has been advanced. When a new time slice begins, the sequencer must play back all the stored events from the previous time slice, before allowing the functional model to operate on events from the new time slice. When the sequencer plays back the accumulated events, it is in playback mode. The sequencer first decrements the global time slice so that the functional mode will believe it is in the previous time slice. The sequencer then sorts the events stored in the event list according to the priority level stored with each event's signature in the OrderDef list. Next, the sequencer sends the events to the functional model in the sorted order by calling the functional model's SendEvent function. Finally, after all the stored events have been sent to the functional model, the sequencer resets the global time slice to its correct value. The sequencer also sets CurrTime to be equal to the global time slice. Upon updating CurrTime, the sequencer changes its mode of operation back to the accumulation mode. By descending functional models from the FuncModSeq class, race condition event ordering is achieved while adding no lines of additional event handling code to the functional model. Only AddOrder Constraint calls are added to the constructor of the model. In addition, the event sequencer is generic according to the present invention, and is not dependent on the specific functional model it is used in. Only the proper order of the race condition events needs to be specified for reception by the functional model. Because all simulation events are routed through FuncModSeq, all functional models are forced to accept the computational and memory allocation overhead produced the sequencer that is present in FuncModSeq.

Figure 6:
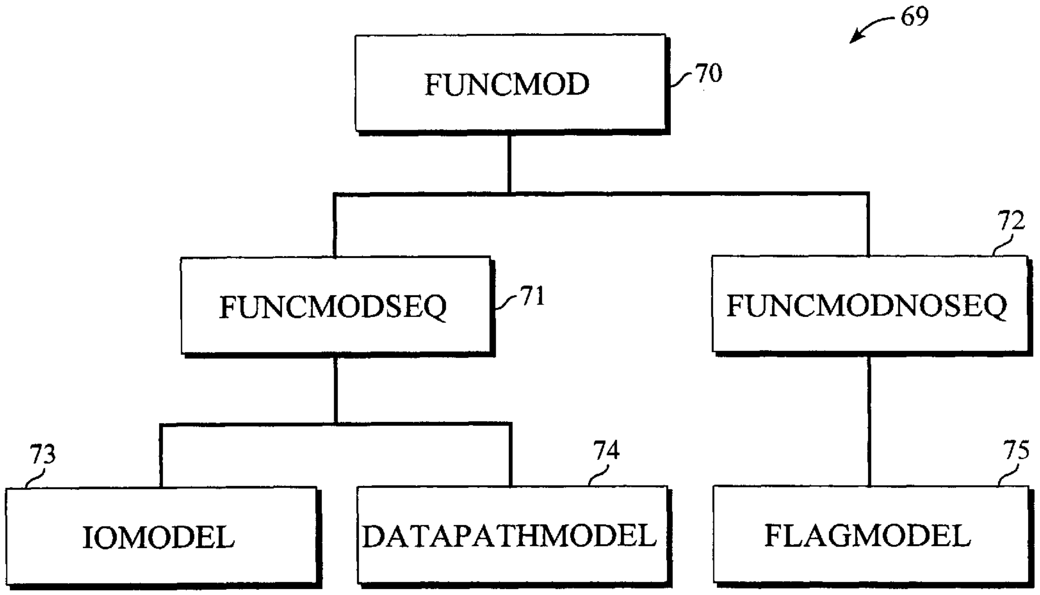
FIG. 6 is a diagram of an alternative class hierarchy for models not requiring sequencing.

Referring now to FIG. 6, there is shown a diagram of an alternative class hierarchy for models not requiring sequencing. Accordingly, the functional model will not carry the execution overhead introduced by a sequencer, in cases which are inherently race condition free. The hierarchy 69 includes a functional model 70 (i.e., FuncMod), a functional model sequencer 71 (i.e., FuncModSeq), a functional model no sequence 72 (i.e., FuncModNoSeq), an input output model 73(i.e., IOModel), a data path model 74 (i.e., DataPathModel), and a flag model 75 (i.e., FlagModel). In particular, FlagModel is descended from the FuncModNoSeq class instead of the FuncModSeq class. Thus, the FuncModNoSeq class duplicates the class containing the sequencer, i.e., FuncModSeq, in substantially all respects except for FuncModSeq's contained sequencer code that is added to the verification framework's class hierarchy. By descending functional models from the duplicated class rather than the original class, simulation events are effectively routed around the sequencer. Functional models descended from the duplicate class will not incur the computational and memory overhead created by the sequencer. The two parent classes (FuncModSeq and FuncModNoSeq) are identical is all respects except for the implementation of their SendEvent__Func functions. The SendEvent__Func function in FuncModNoSeq directly calls the Send event function in the functional model. By introducing the FuncModNoSeq class, event sequencing may be circumvented without modifying the verification framework code. FuncModSeq and FuncModNoSeq are both descended from the FuncMod class. The FuncMod class provides a standardized interface for the verification framework to communicate with the various functional models.

More particularly, while the sequencer according to the present invention is useful and beneficial, its implementation can involve substantial computational overhead. It is accordingly desirable that functional models that do not require the services of a sequencer should not carry an unnecessary computational overhead. Nor should unnecessary memory allocation requirements be incurred.

The following example pseudo-code makes operation of a generalized functional model according to the present invention more explicit:

```
class FuncMod
  {
  virtual SendEvent__Func(..)=0;
  }
class Funcmodseq: public FuncMod
  {
  virtual SendEvent__Func(..);
  }
Implements sequencing code
Funcmodseq::SendEvent__Func(..);
  {
  Perform sequencing tasks;
  If event not sequenced
    Send event to functional model;
  }
class Funcmodnoseq: public FuncMod
  {
  virtual SendEvent__Func(..);
  }
  //Does not implement sequencing.code
Funcmodnoseq::SendEvent__Func(..)
  {
  Send event to functional model;
  }
//Sequencer overhead
class IOModel: public Funcmodseq
  {
  .
  .
  .
  }
//No sequencer overhead
  class FlagModel: public Funcmodnoseq
  {
  .
  .
  .
  }
```

The above pseudo-code particularly expresses the scheme of operation for a functional model that contains code switching from sequencer code overhead, when peripheral functions are modeled which clearly do not require re-sequencing of events which might arrive out of order. Accordingly, the object oriented code provided defines a particular custom class of functional models for use in peripheral or non-peripheral (e.g., DSP or other digital semiconductor device or system) testing and evaluation with or without a verification environment, for pre-production or other testing activity. The custom class of functional models provides for a virtual SendEvent__Func(..)=0 which has two classes: a functional model providing for sequencing, and a functional model providing for no sequencing. Accordingly, if an event is detected that does not require sequencing, the event is sent directly to the functional model for processing.

The mechanism for sending such events directly for processing to the functional model is the class Funcmodnoseq. The Funcmodnoseq calls the function virtual SendEvent__Func(..) to dispatch the event directly to functional model processing, without implementing any sequencing code for the event detected. On the other hand, if an event is detected that does require sequencing, then predetermined sequencing code is implemented to perform predetermined sequencing tasks. If the event that requires sequencing is not sequenced, it is sent directly to the functional model for processing. According to this embodiment of the present invention, operation is subject to the overhead of the sequencer code.

Figure 7:
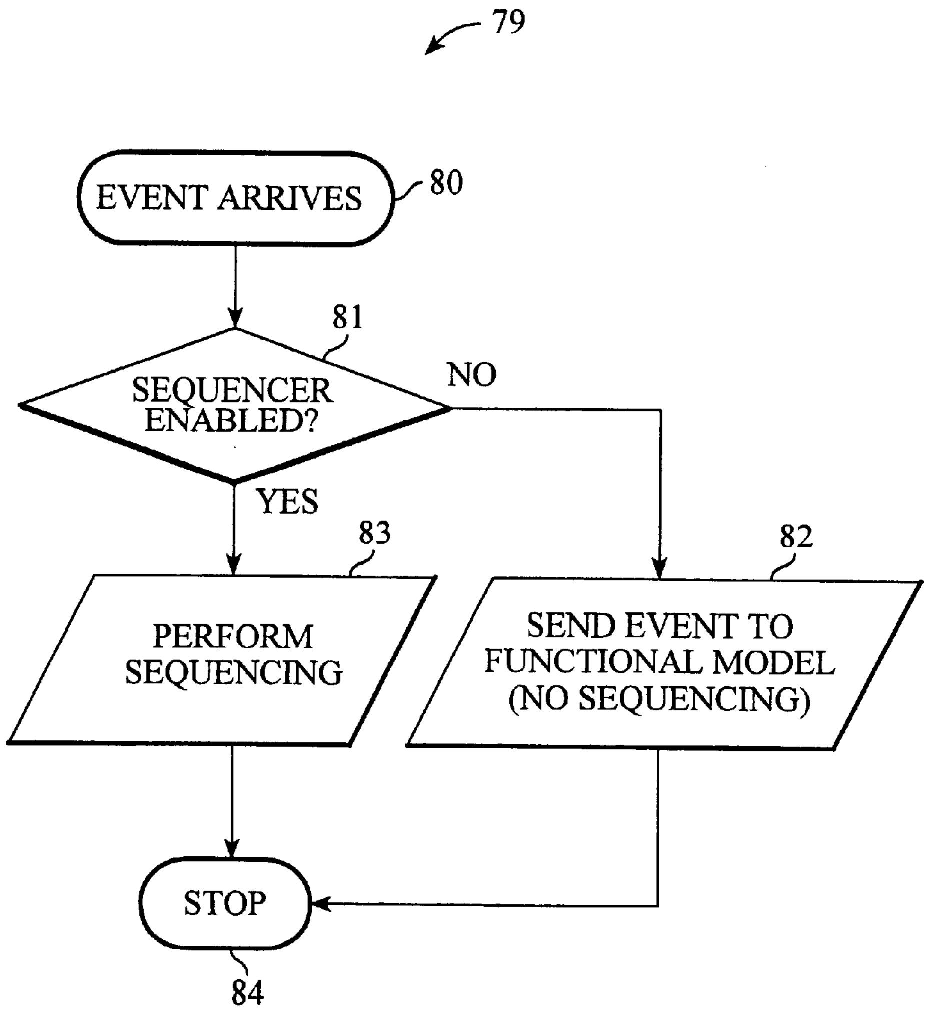
FIG. 7 is a flow chart of a conditional execution methodology according to one embodiment of the present invention.

Referring now to FIG. 7, there is shown a flow chart of a conditional execution methodology 79 according to one embodiment of the present invention. In particular, the conditional execution methodology 79 includes detecting the arrival 80 of an event, followed by a determination 81 of whether or not the sequencer is enabled. The determination 81 is implemented according to one embodiment with a conditional instruction covering the indicated functionality. If the sequencer is not enabled, the event is sent 82 to the functional model (without any sequencing). If, on the other hand, the sequencer has been enabled, then sequencing is performed 83. In either case, after dispatch (i.e., or "sending") of the event to the functional model or after sequencing has been performed, operation of the conditional execution methodology stops 84. According to this embodiment of the present invention, a conditional block checks a flag to determine whether the sequencer is to be enabled for the functional model. An application programming interface is configured to permit the user to enable or disable the sequencer, i.e., respectively to set or clear the flag. According to this embodiment, the processor executes a branch instruction to determine if the sequencer is enabled when the verification framework sends a simulation event. This embodiment is dependent upon the affirmative allocation of sequencer memory spaces, for functional models of all kinds. Further, the functional models are dependent upon an application program interface call to enable and/or disable the sequencer.

In summary, according to the present invention, the ordered arrival of race condition events at a functional model is ensured according to a pre-defined order, independent of the particular functionality and features of the functional model employed. According to the present invention, the correctness of arrival sequences for race condition events in a functional model is ensured by a sequencer, without substantial modification being made of the functional model code. With a sequencer according to the present invention, independence of the functional model is ensured, permitting the sequencer code to be reused in user selected operational modes without reference to a particular functional model. According to the present invention, sequencing of scalable numbers of events is enabled without a concomitant increase in model complexity. Further, such sequencing of race events is independent of and does not affect un-sequenced events. Further according to the present invention, the sequencer obviates the need to modify design-under-test code or HDL code, substantially reducing functional model design times. Additionally, the sequencer of the present invention includes a functional verification modeling framework which is object oriented. The verification framework communicates events from the HDL simulator to the verification functional models via a class hierarchy. A sequencer object placed within the class hierarchy intercepts events intended for the functional model in an appropriate order. By descent of functional model object classes from an existing class hierarchy, the sequencer according to the present invention is available to the functional model. The model code specifies the order in which it must receive race condition events, by calling a predetermined sequencer function. According to an initialization sequence for the functional model used in connection with the present invention, the events to be ordered by the sequencer are registered. Further according to the present invention, the functional model sends a set of unique identifiers (e.g., the event's signature) and the event priority. Events with low numeric priority are ensured to arrive at the functional model before events having higher numeric priority. The verification framework according to the present invention, first forwards each event to the sequencer that is employed by the functional model (by calling the event communication function call for the sequencer). The sequencer compares the signature of the current event to the signatures that are stored in its OrderDef list. If there is no match or the list is empty, the sequencer sends the event to the functional model for immediate action. If there is a match, the sequencer stores the arguments from the event communication function call in an Event list, according to a sequencer event accumulation mode of operation according to the invention. The sequencer repeatedly treats events accordingly until the simulation time slice advances. When the simulation time slice advances, the sequencer sets the time slice a single tick back for its associated functional model. The functional model is accordingly left in the last time slice.

The sequencer according to the present invention then orders the events in its Event list according to the priority level stored with each corresponding event signature in the sequencer's OrderDef list. After performing the ordering, the sequencer calls the event communication function of the functional model, sending each set of event arguments from the Event list in turn. By reordering events that arrive in or during the same time slice, the sequencer ensures that the events will arrive at the functional model in the proper order. Finally, when the sequencer sends the stored events to the functional model, it is in the playback mode. According to a method according to the present invention, race condition events are defined by passing an event signature and a priority level for each sequencer event. Verification runs begin with time-slice zero. The sequencer compares each arriving event to the event signatures in its OrderDef list. After performing the ordering, the sequencer calls an event communications function of the functional model, sending each set of event arguments from the Event list in turn. By reordering events that arrive in the same time slice, the sequencer sends the stored events to the functional module, according to a playback mode according to the present invention. In operation, the system for ordering race condition events according to the present invention effects the ordering of race condition events that are to be ordered as defined by passage of the event's signature and priority level for each event to the sequencer. Next, a verification run begins as to a time slice zero (0). Before the time slice advances, the sequencer compares each arriving event to the event signatures in an OrderDef list. If an event matches a stored signature, then the sequencer stores the event in its Event list. If the event does not match a stored signature, then the sequencer passes the event to the functional model. When the time slice advances, the sequencer decrements the functional model's time slice. The sequencer then sorts the stored events according to a priority level stored with each event's signature in the OrderDef list. The sequencer sends the events in their sorted order to the functional model for immediate action. When all stored events have been sent, the sequencer increments the time slice of the functional model, effectively advancing the functional model to the verification system's global time slice value.

What is claimed is:

1. A method for sequencing events for a functional model, comprising:

intercepting, by an event sequencer, an event, that is intended for a functional model, based on an order that the event is received;

determining, by the event sequencer, if the event needs to be re-sequenced;

storing and ordering, by the event sequencer, call information for the event, that needs to be re-sequenced, in an events list based on a priority designation for the event; and sending, by the event sequencer, the call information for the event in a corresponding order in the events list to the functional model to respectively call the event.

2. The method according to claim 1, wherein determining, by the event sequencer, if the event needs to be re-sequenced further comprises:

registering various events that need to be re-sequenced for the functional model in an order defining list.

3. The method according to claim 2, wherein registering the various events that need to be re-sequenced for the functional model in an order defining list further comprises:

storing in a memory system signatures that identify the various events; and storing in the memory system the priority designations that identify the priorities of the various events in the order defining list.

4. The method according to claim 3, wherein:

the determining step further comprises comparing a signature of the event intended for the functional model with the signatures of the various events in the order defining list;

the storing and ordering step further comprises, in response to the signature matching one of the signatures of the various events in the order defining list, storing the call information for the event intended for the functional model in the events list; and the sending step further comprises, in response to the signature of the event not matching one of the signatures of the various events in the order defining list, sending, by the event sequencer, the call information for the event to the functional model to respectively call the event.

5. The method according to claim 4, wherein:

the determining step further comprises determining whether the events list is empty and, in response to the events list being empty, comparing the signature of the event intended for the functional model with the signatures of the various events in the order defining list.

6. The method according to claim 1, further comprising:

setting the event sequencer back to a time period for executing events of the functional model; and playing back the events of the functional model based on the corresponding re-sequenced order in the events list.

7. The method according to claim 1, wherein the event that needs to be re-sequenced is a race condition event that needs to be re-ordered.

8. An event sequencer for a functional model, comprising:

a memory system for storing call information for an event, that needs to be re-sequenced, in an events list based on a priority designation for the event; and a processor coupled to the memory system wherein the processor executes instructions for:

intercepting an event, that is intended for a functional model, based on an order that the event Is received;

determining if the event needs to be re-sequenced;

ordering the call information for the event, that needs to be re-sequenced, in the events list based on the priority designation for the event; and sending the call information for the event in a corresponding order in the events list to the functional model to respectively call the event.

9. The event sequencer according to claim 8, wherein the memory system further comprises an order defining list that registers various events that need to be re-sequenced for the functional model.

10. The event sequencer according to claim 9, wherein the memory system further stores signatures that identify the various events and the priority designations that identify the priorities of the various events in the order defining list.

11. The event sequencer according to claim 10, wherein the processor further executes instructions for comparing a signature of the event intended for the functional model with the signatures of the various events in the order defining list;

in response to the signature matching one of the signatures of the various events in the order defining list, storing the call information for the event intended for the functional model in the events list; and in response to the signature of the event not matching one of the signatures of the various events in the order defining list, sending, by the event sequencer, the call information for the event to the functional model to respectively call the event.

12. The event sequencer according to claim 11, wherein the processor further executes the instructions for:

determining whether the events list is empty; and in response to the events list being empty, comparing the signature of the event intended for the functional model with the signatures of the various events in the order defining list.

13. The event sequencer according to claim 8, wherein the processor further executes the instruction for:

setting the event sequencer back to a time period for executing events of the functional model; and playing back the events of the functional model based on the corresponding re-sequenced order in the events list.

14. The event sequencer according to claim 8, wherein the event that needs to be re-sequenced is a race condition event that needs to be reordered.

15. A method for executing events for a functional model, comprising:

determining whether functional model events for a functional model require sequencing;

in response to the functional model events not requiring sequencing, by-passing an event sequencer;

in response to the functional model events requiring sequencing, intercepting, by the event sequencer, an event that is intended for the functional model, based on an order that the event is received;

determining, by the event sequencer, If the event needs to be re-sequenced;

storing and ordering, by the event sequencer, call information for the event, that needs to be re-sequenced, in an events list based on a priority designation for the event; and sending, by the event sequencer, the call information for the event in a corresponding order in the events list to the functional model to respectively call the event.

16. The method according to claim 15, wherein determining, by the event sequencer, if the event needs to be re-sequenced further comprises:

registering various events that need to be re-sequenced for the functional model in an order defining list.

17. The method according to claim 16, wherein registering the various events that need to be re-sequenced for the functional model in an order defining list further comprises:

storing in a memory system signatures that identify the various events; and storing in the memory system the priority designations that identify the priorities of the various events In the order defining list.

18. The method according to claim 17, wherein:

the determining step further comprises comparing a signature of the event intended for the functional model with the signatures of the various events in the order defining list;

the storing and ordering step further comprises, in response to the signature matching one of the signatures of the various events in the order defining list, storing the call information for the event intended for the functional model in the events list; and the sending step further comprises, in response to the signature of the event not matching one of the signatures of the various events in the order defining list, sending, by the event sequencer, the call information for the event to the functional model to respectively call the event.

19. The method according to claim 18, wherein:

the determining step further comprises determining whether the events list is empty and, in response to the events list being empty, comparing the signature of the event intended for the functional model with the signatures of the various events in the order defining list.

20. The method according to claim 15, further comprising:

setting the event sequencer back to a time period for executing the functional model events of the functional model; and playing back the functional model events of the functional model based on the corresponding re-sequenced order in the events list.

21. The method according to claim 15, wherein the event that needs to be re-sequenced is a race condition event that needs to be re-ordered.

* * * * *